United States Patent [19]

Fusek

[11] Patent Number: 4,516,833
[45] Date of Patent: May 14, 1985

[54] PRODUCTION OF HIGH PERFORMANCE OPTICAL SPATIAL FILTERS

[75] Inventor: Richard L. Fusek, Dayton, Ohio

[73] Assignee: University of Dayton, Dayton, Ohio

[21] Appl. No.: 453,408

[22] Filed: Dec. 27, 1982

[51] Int. Cl.³ .......................... G03H 1/16; G02B 5/22
[52] U.S. Cl. ............................... 350/162.12; 350/3.69
[58] Field of Search ...................... 350/162.12, 162.13, 350/162.14, 3.69, 3.83

[56] References Cited

U.S. PATENT DOCUMENTS

| | | |
|---|---|---|
| 3,614,232 | 10/1971 | Mathisen . |
| 3,630,596 | 12/1971 | Watkins .......................... 350/162.12 |
| 3,658,420 | 4/1972 | Axelrod ...................... 350/162.12 X |
| 3,738,752 | 6/1973 | Heinz et al. . |
| 3,790,280 | 2/1974 | Heinz et al. ...................... 350/162.12 |
| 3,972,616 | 8/1976 | Minami et al. . |
| 4,000,949 | 1/1977 | Watkins . |

OTHER PUBLICATIONS

Hauke F. E. et al., "Light Range Extending Method", IBM Tech. Disclosure Bulletin, vol. 14, No. 11, Apr. 1972, pp. 3391–3392.
Dammann H., et al., "Removal of Nonperiodic Structures from a Periodic Image by Means of Spatial Filtering", Optics Communications, vol. 3, No. 4, pp. 251–253.
"Filtering of Defects in Integrated Circuits with Orientation Independent", 10 Applied Optics, 2097, (Sep., 1971) Will and Pennington.

Primary Examiner—Bruce Y. Arnold
Attorney, Agent, or Firm—Biebel, French & Nauman

[57] ABSTRACT

High performance optical spatial filters are produced photographically with an apparatus that directs a coherent beam of light through or off a subject and into a lens. The lens focuses the diffracted and/or reflected light to define a Fourier transform of the subject information. A filter is produced by exposing a photographic plate at the Fourier transform plane, processing the plate, and repositioning it. A hologram is recorded through the processed plate with the apparatus, which directs a reference beam to a holographic recording plane. A second photographic plate is placed at the transform plane and exposed with light directed through the hologram from a direction conjugate to the reference beam. The second plate is then processed. Successive generations of filters may also be produced. A method of using the filters for isolating nonperiodic defects in IC photomasks and wafers is also disclosed.

18 Claims, 7 Drawing Figures

PRODUCTION OF HIGH PERFORMANCE OPTICAL SPATIAL FILTERS

BACKGROUND OF THE INVENTION

The present invention relates to the production of optical spatial filters, and more particularly, to the production of such filters for use in inspecting IC photomasks and wafers with a holographic optical processor.

As is well known in the art, an optical Fourier transformation can be performed on a subject by illuminating the subject with a coherent light source and using a lens to image the subject at infinity. The Fourier transform of the original subject information will occur in a plane located at the focus caused by the lens. With this process, subject information is redistributed in the Fourier transform plane to correspond to spatial frequency content. If the subject consists of repetitive spatial frequency components such as is present on photomasks used in the production of microelectronic circuits, the optical Fourier transform will consist of an array of regularly spaced points of light whose distance from the optical axis is proportional to the spatial frequency.

By placing a blocking filter that is opaque at each of these points within the Fourier transform plane, and then performing an inverse transform, the resulting image contains only nonrepetitive information about the original subject. For example, nonrepetitive defects in the original photomask or wafer would pass this spatial filter and be reimaged, but repetitive circuit information would not. This technique offers a potentially powerful tool for locating critical defects in complex photomasks and wafers. Producing an accurate blocking filter, however, has proven to be a difficult task for several reasons.

First, it is known that the location and size of the necessary opaque regions in the filter can be accurately calculated according to well known optical principles, allowing for the production of a filter by computer generation or other synthetic means. Such a technique is relied upon, for example, in U.S. Pat. No. 4,000,949, issued Jan. 4, 1977 to Watkins, and in U.S. Pat. No. 3,738,752, issued June 12, 1973 to Heinz et al. As is recognized in Heinz, however, any aberrations and distortion present in a practical optical system must be accounted for in generating the filter. Therefore, distortions and aberrations in the optical system must be carefully controlled, thus making the system optics extremely expensive and/or reducing the overall performance to less than ideal.

Other approaches include producing filters with increased opaque areas, such as is disclosed in U.S. Pat. No. 3,658,420, issued Apr. 25, 1972 to Axelrod, U.S. Pat. No. 3,972,616, issued Aug. 3, 1976 to Minami et al, and U.S. Pat. No. 3,790,280, issued Feb. 5, 1974 to Heinz et al. Filters produced by these techniques have the advantages of improved universality and noncritical alignment. They also, however, have the disadvantage that the overall transmission to nonrepetitive or defect information is lower, thereby decreasing the detectability of the defects within the subject. In addition, these simple geometry filters consist of opaque crosses, x's, pie-shaped wedges, and variations or combinations of these with or without opaque dots. As a result of these simple and general geometries, the filters do not exactly match the subject information. This leaves a residual background image of the subject, resulting in a low signal-to-noise ratio, and makes automating the analysis of the output of the optical processor much more difficult.

A third alternative technique would be to record the actual location of the points in the optical Fourier transform plane corresponding to repetitive or non-defect subject information on a photographic film or plate. This would seem to allow for an accurate replication of information present in the transform plane, except that the typical dynamic range of intensities within the transform plane can be on the order of $10^{10}$ or higher. Photographic emulsions and other photosensitive materials, however, are typically restricted to dynamic ranges only on the order of $10^3$ to $10^4$. Because of this limited dynamic range, the entire information in the Fourier transform plane cannot be accurately recorded.

What is needed, therefore, is a technique for producing a high performance optical spatial filter that avoids the problems set forth above. In particular, the filters produced by such a technique should enable an optical processor to be capable of detecting defects within the subject photomask or wafer of a relatively subtle nature and isolating those defects in a manner having a relatively high signal-to-noise ratio.

SUMMARY OF THE INVENTION

The present invention provides a technique for producing high performance optical spatial filters based upon the photographic approach discussed above. The multi-generation photographic filter produced by the disclosed method is used within an optical processor suitable for recording holograms of a photomask, wafer or other subject. The processor includes a source of coherent light directed through or towards a subject plane for diffraction and/or reflection by a subject disposed within the subject plane, and then into a lens. The lens focuses the light at a Fourier transform plane and directs the light beyond the transform plane towards a holographic recording plane.

The method of producing filters includes placing a photomask or other subject at the subject plane and placing a first photographic plate or other optical recording means at the Fourier transform plane. The plate is exposed with light from the source directed through or reflected from the subject plane, for an exposure set to properly expose the plate for only the highest intensities within the transform plane. The plate is then processed and repositioned at the transform plane, whereupon a hologram of the subject is recorded through the plate, which now serves as an optical filter. After processing, the hologram is returned to its original position, the beam carrying the original subject information is blocked or removed, and the hologram is illuminated with light directed from the source from a direction which is conjugate to the original reference beam. The first optical filter is replaced with a second photographic plate or recording means at the Fourier transform plane. With the hologram now serving as a subject, the second plate is exposed properly for the highest intensities present in the hologram.

Once processed, the second photographic plate may be replaced at the transform plane for use as what is hereinafter referred to as a second-generation filter. A third-generation filter may also be produced according to the present invention by repositioning the second-generation filter at the transform plane. A second hologram of the subject is recorded through the second-generation filter. After processing, the second hologram is repositioned at the hologram plane, and a third photographic plate is positioned at the transform plane, replacing the second generation filter. The beam carrying the original subject information is removed. The third plate is then exposed with light directed from the source through the second hologram from a direction which is conjugate to the original reference beam.

A method of isolating nonperiodic errors in a photomask, wafer or other subject disposed within the subject plane, using the multi-generation photographic filters, includes directing a coherent beam of light at the photomask such that the light is diffracted or reflected thereby. The diffracted or reflected light is focused so as to define a Fourier transform plane. An optical spatial filter produced by the method described above is placed within the transform plane so as to pass therethrough to an image plane substantially only the light corresponding to nonperiodic errors.

Accordingly, it is an object of the present invention to provide a method of producing high performance optical spatial filters through a photographic technique for use in an optical processor; to provide such a method wherein the filters produced have a relatively high transmission of defect information; to provide such a method wherein the optical processor with which the filters are used has a high signal-to-noise ratio; to provide a method of isolating nonperiodic defects in a photomask, wafer or other subject; and to provide such a method suitable for automated interpretation of the defect information produced.

Other objects and advantages will be apparent from the following description, the accompanying drawings, and the appended claims.

DETAILED DESCRIPTION OF THE PREFERRED EMBODIMENT

Figure 1:
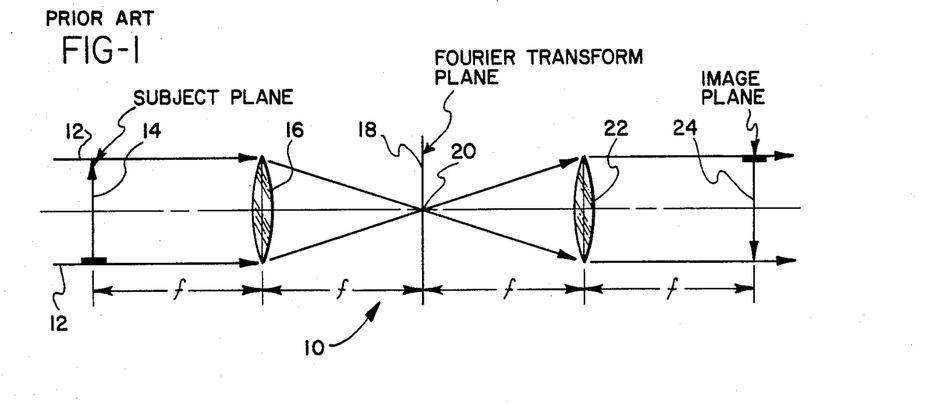
FIG. 1 is a schematic drawing of a simple optical processor.

Referring to FIG. 1, a simple optical processor 10 such as is well known in the art is schematically shown. A collimated coherent beam of light 12 from an appropriate source (not shown) passes through a subject transparency 14 which is located one focal length away from a lens 16. A Fourier transform of subject information will appear at a Fourier transform plane 18 defined by the focus 20 of lens 16. A second lens 22 is positioned one focal length from the transform plane 28 and performs the inverse transform to an image located at 24.

Figure 2:
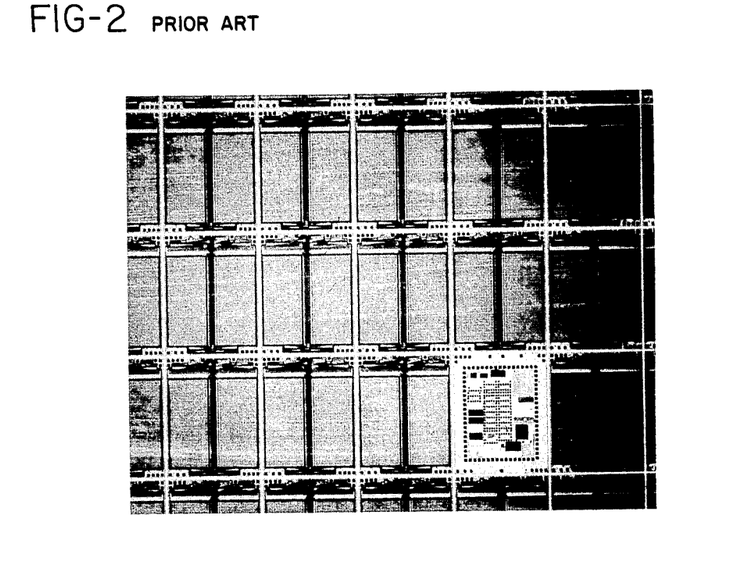
FIG. 2 is a photograph of a portion of a typical IC photomask.
Figure 3:
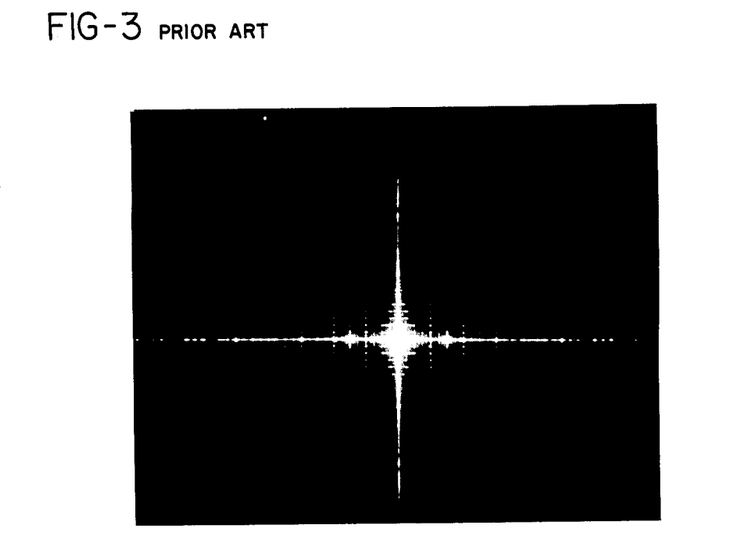
FIG. 3 is a photograph of the optical Fourier transform of the photomask of FIG. 2.

FIG. 2 shows a photograph of a typical IC photomask such as may be used as the subject 14 in the processor of FIG. 1. FIG. 3 shows a photograph of the mask's Fourier transform as it appears at the transform plane 18, from which the complexity of the transform may be appreciated. Because of the limited dynamic range of photographic films and plates and other optical recording means only the high intensity regions, corresponding generally to highly repetitive spatial frequencies present in the subject, can be accurately recorded. If attempts are made to increase the exposure time so that lower intensity regions can be recorded, gross overexposure will occur in the high intensity regions.

Figure 4:
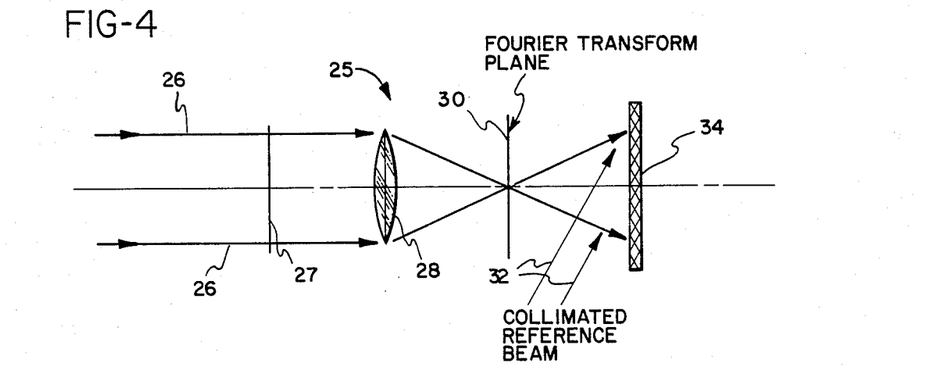
FIG. 4 is a schematic drawing of a holographic optical processor, showing its use in producing a filter.

The present invention provides a method for photographically constructing an optical spatial filter used in the transform plane, but that avoids the problem of recording all frequencies without overexposure. Referring to FIG. 4, a holographic optical processor 25 similar to simple processor 10 is shown. Collimated coherent beam 26 is passed through subject transparency 27 into lens 28, although it will be recognized that beam 26 may also be reflected into lens 28 from a reflecting subject. The diffracted and/or reflected light, which now contains optical information regarding the subject, is passed through lens 28, focusing the light to define a Fourier transform in transform plane 30 one focal length away. A photographic plate is placed within the transform plane 30, and a filter is produced photographically by exposure to the coherent beam 26 passed through the subject transparency 27 with exposure parameters set to accurately expose only the high intensity regions. After standard photographic developing, a negative is produced which will block or attenuate these high intensity regions when replaced at its original position 30.

The subject 27 is then reilluminated with the coherent beam 26. Information passing the filter disposed at the transform plane 30 is recorded, in the form of a hologram, at a location beyond transform plane 30. This is accomplished with the aid of a collimated reference beam 32 directed onto and interfering with subject rays in a recording medium such as a high resolution photographic emulsion 34. The coherent beam 26 is then removed.

Figure 5:
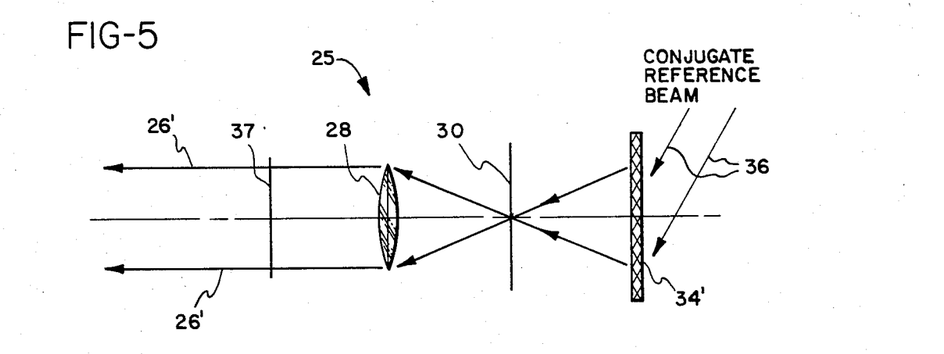
FIG. 5 is a schematic drawing of the processor of FIG. 4, further showing its use in producing a filter, as well as showing the use of the completed filter in isolating nonperiodic subject defects.

After development of the emulsion 34 into hologram 34' and replacement back to its original position, referring now to FIG. 5, the hologram 34' is illuminated with another reference beam 36 which is the conjugate to the original reference beam 32, that is, one with the same wavefront but travelling in the opposite direction. Holographically recorded subject rays 26' will then exactly reverse ray trace their original path forming a Fourier transform at transform plane 30 and a diffraction limited real image 37 at the original position of the subject 27. It will be noted, however, that the recorded hologram 34' contains only subject information minus the information attenuated by the first filter. Therefore, upon reconstruction, the Fourier transform at transform plane 30 produced by the hologram 34' will contain greatly attenuated regions which correspond to the original high intensity areas. The original high intensities have thus been attenuated or compressed in amplitude, although they have not been completely eliminated.

If the hologram 34' is now used as a subject by illumination with conjugate beam 36, as shown in FIG. 5, a Fourier transform is again produced at transform plane 30. A second filter can now be made, recorded more accurately photographically because the range of intensities of the original subject information has been reduced by the attenuation factor of the first filter that was used in producing hologram 34'. After processing, this "second-generation" filter can then in turn be used to record a "third-generation" filter by repeating the process. The original subject 27 is reilluminated by a coherent beam 26, using the holographically produced second-generation filter at the transform plane 30 to record a second hologram. This second hologram will then have greatly attenuated high intensity information and attenuated midrange intensities, since only the lowest intensities present in the Fourier transform have passed the first two filters. This second hologram is then used to record a third filter at the transform plane 30.

This process can be repeated as many times as necessary to achieve the desired degree of opaque areas on the filter matched to spatial frequency content in the transform plane. Experience has shown, however, that normally only second or third-generation filters are needed to inspect IC photomasks.

In practicing the technique described above, both holograms and filters were recorded using a 2-watt Argon laser source operating at 0.5145 micrometers on Agfa-Gaveart 8E56 4"×5" plates, although any photosensitive material with adequate resolution can be used. The exact exposure times will, of course, vary depending on the laser power output, efficiency of the optical system, type of photographic material used, the nature of the subject itself, and efficiency of the hologram. In general, however, using typical photomask geometries, and the photographic plates and laser source noted above, experience has shown that the first generation filter exposures are on the order of one to tens of milliseconds, second generation filters are on the order of tens to hundreds of milliseconds, and third generation filters are on the order of hundreds of milliseconds to seconds. Exact exposures necessary for the particular system and material used can be determined by bracketing exposures or by actual irradiance measurements using a small area detector.

In should be recognized, of course, that the particular photographic plates described above constitute only a preferred optical recording means for the holograms and filters. In fact, the present invention may be practiced using not only photographic films or plates for the holograms and filters, but any other material such as liquid crystal light valves, Pockels read-out optical modulator, thermoplastic films, other crystalline materials, or any other material capable of recording a hologram and/or producing the opaque areas necessary for the filters.

It can be seen that if in any of the filter generation steps, the filter is exposed for too high a density, too much of that corresponding Fourier transform component will be removed from the subject information and will not be adequately holographed. If a subsequent generation filter is needed, this information would not be sufficiently present in the holographically reconstructed Fourier transform plane for new filter generation, resulting in high transmission regions within the filter. This problem can be avoided by controlling the exposure of high intensity regions so that the resulting filter will attenuate these regions only enough to make the transmitted energy in these regions equal to the lower intensity information which it is desired to remove. It is often desirable, however, that the last filter made be exposed and developed for maximum density of opaque areas, for reasons that will be explained below.

Of course, the term "subject", as used herein to refer to the source of information from which the filter is generated, clearly encompasses real objects. It should be understood, however, that in defining the present invention, the subject may also include a hologram of a real object. In such a case, the optical apparatus would include means for reconstructing a real image from the hologram at an image plane by directing a collimated beam through the hologram at the subject plane. The image-carrying beam, after passing through the image plane, is directed into a lens so as to define a Fourier transform of the subject information carried within the beam. The multi-generation filter is then constructed in the normal manner as described above. Such a technique can be useful, for example, in a case where it is desirable to have the real object subject available for some other use while the filter is being produced. A hologram of the object can be made at a convenient time, stored, and then subsequently used as the subject for filter production.

It should be noted that the practicality and desirability of using the filters as will be described for isolating nonperiodic defect information in repetitive subject structures is greatly enhanced because the subject that is used to produce the filter need not be defect free. Nonperiodic defect information from the subject will not localize to specific points in the Fourier transform plane, but rather will be spread over large areas corresponding to all the spatial frequencies corresponding to the particular defect. This energy generally manifests itself as a uniform background haze in the transform plane. Also, because this technique reduces the dynamic range requirements of the filter recording medium, proper exposure and number of generations made will prevent this background haze from being recorded.

Referring back to FIG. 3, it can be seen that the light regions corresponding to repetitive nondefect subject information appearing in the Fourier transform plane are of relatively small area in comparison to the dark regions in the plane. Thus, proper realignment of any of the filter generations within the transform plane for effective attenuation of the subject imformation is critical. In order to reduce this criticality, the photographic plates or other optical recording means used to record each of the generations of the filter may be dithered during their exposure to the subject information. Such dithering will increase size of the opaque areas on the finished filter, resulting in greater tolerance in positioning the filter for use. Since the transparent areas of the filter are relatively large, sufficient defect information will still be passed by the filter.

Figure 6:
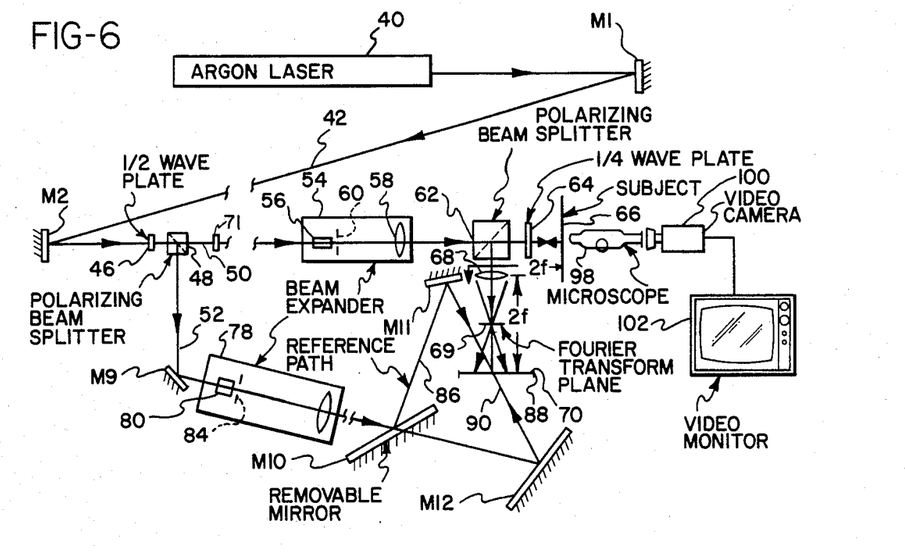
FIG. 6 is a schematic drawing of the preferred apparatus for producing and using filters in conjunction with reflective subjects.
Figure 7:
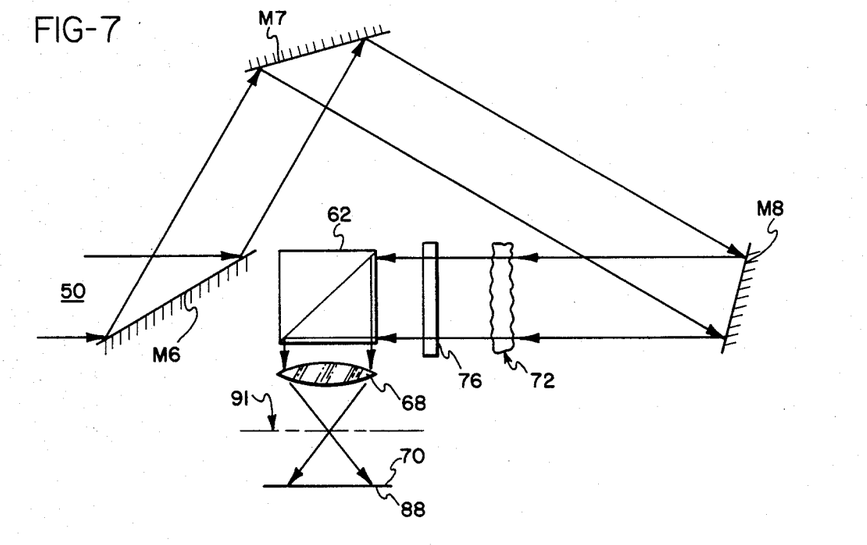
FIG. 7 is a drawing of an alternative embodiment of a portion of the apparatus of FIG. 6 for use when the subject is a transparent or semi-transparent object.

FIGS. 6 and 7 show the preferred optical layouts for apparatus for producing the multi-generation photographic filters as described above, and are set forth in copending, commonly assigned U.S. patent application Ser. No. 348,461, filed Feb. 12, 1982 by Fusek et al entitled "Production of Diffraction Limited Holographic Images."

Using the apparatus of FIG. 6, accurate, effective blocking filters can be produced for reflecting subjects such as IC wafers. A laser 40 provides a source for generating a coherent beam of light 42. In the preferred embodiment, an argon ion laser operating single frequency at a wavelength of 0.5145 micrometers is used, in particular, a Coherent Radiation Model CR-6 Laser. Any laser source, however, whose output wavelength is compatible with the recording medium will work, including but not restricted to helium-neon, krypton, ruby, neodymium YAG or glass, and metal vapor lasers. An intracavity etalon (not shown) provides a coherence length of longer than one meter, although this is not necessary if the path lengths of subject and reference beams are made equal.

Beam 42 is directed by mirrors M1 and M2 into the system 44 and passes through a half-wave plate 46 which allows the angle of polarization to be continuously adjusted before entering the polarizing beamsplitter 48. It should be noted, however, that although polarizing beamsplitting techniques are used in the preferred embodiment to conserve energy and allow maximum flexibility, any beamsplitting technique that divides the incoming beam into two components will work, such as metal films, grating, dielectric films and holographic elements.

Beamsplitter 48 divides the input beam 42 into a subject beam 50 and a reference beam 52 having an intensity ratio determined by the angle of polarization of the incoming beam.

The subject beam 50 is then directed to a means 54 for expanding, filtering and collimating beam 50 including lenses 56 and 58 and a mask having a pinhole 60. It then passes through a second polarizing beamsplitter 62 which serves as a selective beam detector. This is accomplished in the following manner: light entering this director (beamsplitter 62) passes through because of the polarization orientation established by beamsplitter 48. Beam 50 then passes through a quarter-wave plate 64 where it is converted from linear to circular polarization. It then strikes a subject 66 and is reflected thereby back through the quarter-wave plate 64 where it is converted back to linear polarization but orthogonally oriented. This causes the subject beam 50 to be reflected by the beamsplitter 62 towards a lens 68 which forms an image in the vicinity of a means for recording the hologram, and focuses the subject information at a Fourier transform plane 69, located one focal length away from lens 68. In the preferred embodiment, lens 68 is a symmetric doublet pair, imaging subject 66 on or near the recording means at one-to-one magnification to maximize the information collected by the lens 68.

FIG. 7 shows an alternate arrangement for the subject beam optics, used in producing filters for transparent subjects such as IC photomasks. The subject beam 50 is directed around the beamsplitter 62 by mirrors M6 and M7 where it is directed through the subject 72 and half-wave plate 76 by mirror M8. It then passes through the system to the photographic plate 70 as previously described.

Referring back to FIG. 6, the reference beam 52 generated from beamsplitter 48 is directed by mirror M9 towards a means 78 for expanding, filtering and collimating beam 52 consisting of lenses 80 and 82, and a mask having a pinhole 84. Beam 52 is expanded and collimated and directed towards mirror M10. In the hologram recording mode, mirrors M10 and M11 direct the reference beam 52 along reference path 86 to the photographic plate 70 where beam 52 combines with the subject beam 50 to expose plate 70, whereupon a hologram 88 is formed in plate 70.

After processing the hologram 88 and returning it to its position, mirror M10 is removed and mirror M12 directs the reference beam 52 towards the hologram 88 from the conjugate direction along conjugate path 90. Subject information from hologram 88 will then exactly reverse ray-trace back through lens 68 and beamsplitter 62 following the same path but in the reversed direction as the original subject beam 50 during recording. A three-dimensional image of the subject 66 will be formed at its original location. Because of the exact reverse ray-trace feature, optical distortions or aberrations introduced by optical elements such as lens 68, beamsplitter 62, or the like will be elminated, providing a diffraction limited three-dimensional real image.

By placing photographic plates or other recording means within the Fourier transform plane 69 and exposing and processing the plates, according to the method previously described, high performance spatial filters can be produced with the apparatus of FIGS. 6 and 7. During any portion of the filter generation process in which beam 50 carrying the original subject information is blocked or removed, a simple blocking means 71 (FIG. 6) may be inserted into the path of beam 50.

In addition, when used with the multi-generation photographic filters, the apparatus as described provides a simple, effective and unambiguous technique for detecting defects in IC photomasks and wafers. Once a multi-generation filter of a subject containing highly repetitive subject information has been produced, that subject or another subject containing the same information is located as indicated at 66 in FIG. 6 or 72 in FIG. 7. The filter is then placed in the transform plane 69, and a hologram 88 is recorded. The filter and subject are removed, and the filtered subject information is reconstructed at the original subject location. Alternatively, the hologram 88 may be recorded without the filter in place. The filter is then placed into the transform plane 69 during reconstruction.

In either case, subject information corresponding to defects in the test subject is freely passed by the filter, and will be reconstructed at the original subject location. As seen in FIG. 6, a microscope 98 is used for magnification during observation of the defect information, and a video camera 100 and monitor 102 may be provided to display the information. It is important to note that once the hologram 88 of the subject is made, the subject itself is no longer needed for defect analysis.

It will be recognized that optimization of the resolution achievable with the apparatus shown in FIGS. 6 and 7 is dependent upon maintaining identical optical path lengths in either direction between the subject/reconstruction plane at 66 and the holographic recording plane at 70, regardless of the presence or absence of a photographic plate (or other recording means) in the transform plane 69. Accordingly, in any step of the filter producing or using methods in which a photographic plate is not present in transform plane 69, an appropriate compensating plate (not shown) should be inserted so that an identical optical path length may be maintained.

In using any optical spatial filter, some non-defect subject information, referred to as background, does pass through the filter. For this reason, it is desirable to expose and develop the finalgeneration filter for maximum density of opaque areas, whereby as much background as possible may be eliminated. When a filter constructed according to the present invention is used, moreover, the large signal-to-noise ratio achieved between defect and background information enables most background information to be eliminated simply by reducing the video monitor brightness and increasing contrast.

Additionally, due to the large signal-to-noise ratio, the background can be totally eliminated by processing the video signal prior to display through a simple log amplifier. This capability is particularly important to enable computer analysis in an automated inspection system.

Notwithstanding the need in some applications to completely remove the background information, in some cases it may be desirable to permit a small portion of the background to pass through the filter. This may be accomplished by slightly over- or underexposing one or more generations of the filter so that a portion of the nondefect information will pass through the final filter. This is particularly useful, for instance, where the filter is to be used in manual inspection of the subject and/or for determining the specific location of particular defects, since the nondefect information will appear along with the defect information for inspection. Because only a small portion of the background is passed through the filter, however, the background will appear at much lower intensity than the defect information. Thus, the defects can, due to their relative brightness, be easily identified and localized.

While the methods herein described, and the forms of apparatus for carrying these methods into effect, constitute preferred embodiments of this invention, it is to be understood that the invention is not limited to these precise methods and forms of apparatus, and that changes may be made in either without departing from the scope of the invention, which is defined in the appended claims.

What is claimed is:

1. A method of producing an optical spatial filter corresponding to a subject disposed within a subject plane, comprising the steps of:
   directing a first coherent beam of light at said subject such that said light is diffracted and/or reflected thereby, whereafter said light contains optical information regarding said subject;
   focusing said light containing said subject information so as to define a Fourier transform plane;
   disposing a first optical recording means at said Fourier transform plane and exposing said recording means with said light containing said subject information;
   recording upon said first recording means at least partially opaque areas corresponding to at least a portion of said subject information as said information appears within said transform plane;
   attenuating at least a portion of said subject information by directing said light containing said information through said first recording means located within said transform plane;
   directing a second coherent beam of light, through a holographic recording plane located beyond said transform plane, from a first direction so as to form an interference pattern in said recording plane with said light containing said subject information minus said information partially attenuated by said first recording means;
   recording at said recording plane a first hologram of said partially attenuated subject information;
   removing said first beam;
   removing said first recording means from said transform plane;
   disposing a second optical recording means at said transform plane;
   redirecting said second beam through said hologram at said recording plane from a second direction opposite said first direction, whereby said second recording means is exposed with light from said second beam containing optical information from said hologram; and
   recording upon said second recording means at least partially opaque areas corresponding to at least a portion of said hologram information as said information appears within said transform plane.

2. A method as defined in claim 1, wherein said first optical recording means is exposed for a time sufficient to record only high intensity regions within said transform plane.

3. A method as defined in claim 2, wherein said second optical recording means is exposed for a time sufficient to record regions of intensity within said transform plane lower than those recorded on said first recording means.

4. A method as defined in claim 1, comprising the further steps of:
   removing said first hologram from said recording plane;
   redirecting said first beam of light at said subject and focusing said light containing said subject information so as to define said transform plane;
   redirecting said second beam through said recording plane from said first direction;
   attenuating at least a further portion of said subject information by directing said light containing said information through said second recording means located within said transform plane;
   recording at said recording plane a second hologram of said further partially attenuated subject information;
   removing said first beam;
   removing said second recording means from said transform plane;
   disposing a third optical recording means at said transform plane;
   redirecting said second beam through said second hologram at said recording plane from said second direction, whereby said third recording means is exposed with light from said second beam containing optical information from said second hologram; and
   recording upon said second recording means at least partially opaque areas corresponding to at least a portion of said second hologram information as said information appears within said transform plane.

5. A method as defined in claim 1, wherein said first and said second optical recording means are photographic plates.

6. A method as defined in claim 4, wherein said first, said second, and said third optical recording means are photographic plates.

7. A high performance multi-generation optical spatial filter, comprising the product resulting from the process including the steps of:
   positioning a subject within a subject plane;
   directing a first coherent beam of light at said subject such that said light is diffracted and/or reflected thereby, whereafter said light contains optical information regarding said subject;
   focusing said light containing said subject information so as to define a Fourier transform plane;
   disposing a first optical recording means at said Fourier transform plane and exposing said recording means with said light containing said subject information;

recording upon said first recording means at least partially opaque areas corresponding to at least a portion of said subject information as said information appears within said transform plane;

attenuating at least a portion of said subject information by directing said light containing said information through said first recording means located within said transform plane;

directing a second coherent beam of light, through a holographic recording plane located beyond said transform plane, from a first direction so as to form an interference pattern in said recording plane with said light containing said subject information minus said information partially attenuated by said first recording means;

recording at said recording plane a first hologram of said partially attenuated subject information;

removing said first beam;

removing said first recording means from said transform plane;

disposing a second optical recording means at said transform plane;

redirecting said second beam through said hologram at said recording plane from a second direction opposite said first direction, whereby said second recording means is exposed with light from said second beam containing optical information from said hologram; and recording upon said second recording means at least partially opaque areas corresponding to at least a portion of said hologram information as said information appears within said transform plane.

8. A filter as defined in claim 7, wherein said process further includes:

removing said first hologram from said recording plane;

redirecting said first beam of light at said subject and focusing said light containing said subject information so as to define said transform plane;

redirecting said second beam through said recording plane from said first direction;

attenuating at least a further portion of said subject information by directing said light containing said information through said second recording means located within said transform plane;

recording at said recording plane a second hologram of said further partially attenuated subject information;

removing said first beam;

removing said second recording means from said transform plane;

disposing a third optical recording means at said transform plane;

redirecting said second beam through said second hologram at said recording plane from said second direction, whereby said third recording means is exposed with light from said second beam containing optical information from said second hologram; and recording upon said second recording means at least partially opaque areas corresponding to at least a portion of said second hologram information as said information appears within said transform plane.

9. A filter as defined in claim 7, wherein said first and said second optical recording means are photographic plates.

10. A filter as defined in claim 8, wherein said first, said second, and said third optical recording means are photographic plates.

11. A method of isolating nonperiodic defects in a subject disposed within a subject plane, using the high performance multi-generation optical spatial filter defined in claim 7, comprising the steps of:

directing a coherent beam of light at said subject such that said light is diffracted and/or reflected thereby, whereafter said light contains optical information regarding said subject;

focusing said light containing said subject information so as to define a Fourier transform plane; and disposing within said transform plane said optical spatial filter so as to pass therethrough substantially only said light containing said subject information corresponding to nonperiodic defects.

12. The method as defined in claim 11, comprising the further steps of:

recording on a photosensitive medium a hologram with said light containing said subject information passed through said filter;

removing from said subject plane said subject; and reconstructing at said subject plane information from said hologram corresponding to nonperiodic defects.

13. A method of isolating nonperiodic defects in a subject disposed within a subject plane, using the high performance multi-generation optical spatial filter defined in claim 7, comprising the steps of:

directing a coherent beam of light at said subject such that said light is diffracted and/or reflected thereby, whereafter said light contains optical information regarding said subject;

focusing said light containing said subject information so as to define a Fourier transform plane;

recording on a photosensitive medium a hologram with said light passed beyond said transform plane;

removing from said subject plane said subject;

disposing within said transform plane said optical spatial filter; and reconstructing at said subject plane only subject information from said hologram passed by said filter and corresponding to nonperiodic defects.

14. Apparatus including the high performance multi-generation optical spatial filter defined in claim 7, for isolating nonperiodic defects in a subject disposed at a subject plane, comprising:

a source for generating a substantially coherent beam of light;

means directing at least a portion of said beam of light at said subject such that said light is diffracted and/or reflected by said subject, whereafter said light contains optical information regarding said subject;

a lens for passing therethrough said light containing said subject information, and focusing said light so as to define a Fourier transform plane; and said optical spatial filter, removably disposable at said Fourier transform plane.

15. The apparatus as defined in claim 14, further comprising:

a beamsplitter for dividing said coherent beam, prior to direction to said subject, into a subject and a reference beam, said subject beam being directed at said subject;

means for recording a hologram of said subject thereon, said lens further imaging said light containing said subject information onto or near one side of said means for recording;

means for directing said reference beam to said one side of said means for recording from a first direction at a predetermined angle of incidence thereon; and means for directing said reference beam to the opposite side of said means for recording in a conjugate direction exactly opposite said first direction, for diffraction thereby into said lens in a direction exactly opposite to that traveled by said subject beam therethrough, for reconstruction at said subject plane of defect information pertaining to said subject.

16. A method of producing an optical spatial filter corresponding to a subject or subjects similar thereto, said subject being disposed within a subject plane, comprising the steps of:

directing a first coherent beam of light from a source toward said subject such that said light is diffracted and/or reflected thereby, whereby said light contains optical information regarding said subject;

focusing said light containing said subject information so as to define a Fourier transform plane;

placing a first photographic plate at said Fourier transform plane and exposing said plate with said light containing said subject information for a time sufficient to record only high intensity regions within said transform plane;

developing said first plate to produce darkened portions thereon corresponding to said high intensity regions, said plate thereafter being located in its original position in said transform plane to attenuate high intensity light directed into said transform plane;

directing a second coherent beam of light from said source through a holographic recording plane beyond said transform plane from a first direction, while continuing to direct said first beam toward said subject, so as to form an interference pattern in said recording plane with said second beam and said light containing said subject information minus said information attenuated by said first plate;

recording at said recording plane a first hologram of said partially attenuated subject information;

removing said first beam;

removing said first plate from said transform plane;

placing a second photographic plate at said transform plane;

redirecting said second beam through said hologram at said recording plane from a second direction opposite said first direction, whereby said second plate is exposed with light from said second beam for a time sufficient to record both regions of intensity within said transform plane lower than those recorded on said first photographic plate, and originally high regions of intensity attenuated by said first plate during recording of said first hologram; and developing said second plate to produce darkened portions thereon corresponding to said lower regions of intensity and said originally high regions of intensity.

17. A method as defined in claim 16, wherein said first photographic plate, subsequent to exposure thereof, is removed from said transform plane to a location remote therefrom for developing and is then replaced within said transform plane, and wherein said second photographic plate, subsequent to exposure thereof, is removed from said transform plane to a location remote therefrom for developing.

18. A method as defined in claim 16, comprising the further steps of dithering said first and said second photographic plates simultaneously with exposures thereof.

* * * * *